United States Patent
Wan et al.

(10) Patent No.: US 10,386,572 B1
(45) Date of Patent: Aug. 20, 2019

(54) ELECTRONIC DEVICE DISPLAY WITH A BACKLIGHT

(71) Applicant: Apple Inc., Cupertino, CA (US)

(72) Inventors: Ka Kuen Wan, San Jose, CA (US);
Agnes Lee, Saratoga, CA (US); Alex D. Schlaupitz, Los Gatos, CA (US); David S. Hum, Sunnyvale, CA (US); Ming Xu, Cupertino, CA (US); Shawn P. Hurley, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/110,893

(22) Filed: Aug. 23, 2018

Related U.S. Application Data

(60) Provisional application No. 62/662,023, filed on Apr. 24, 2018.

(51) Int. Cl.
*F21V 7/04* (2006.01)
*F21V 8/00* (2006.01)
*H05K 1/18* (2006.01)
*H05K 1/02* (2006.01)

(52) U.S. Cl.
CPC .......... *G02B 6/0083* (2013.01); *G02B 6/009* (2013.01); *G02B 6/0051* (2013.01); *G02B 6/0053* (2013.01); *G02B 6/0055* (2013.01); *G02B 6/0068* (2013.01); *G02B 6/0085* (2013.01); *G02B 6/0088* (2013.01); *H05K 1/0203* (2013.01); *H05K 1/189* (2013.01); *H05K 2201/10106* (2013.01); *H05K 2201/10522* (2013.01)

(58) Field of Classification Search
None
See application file for complete search history.

(56) References Cited

U.S. PATENT DOCUMENTS

| | | | |
|---|---|---|---|
| 7,944,527 B2 | 5/2011 | Jeon et al. |
| 7,965,349 B2 | 6/2011 | Oohira |
| 8,054,283 B2 | 11/2011 | Lee et al. |
| 8,469,575 B2 | 6/2013 | Weber et al. |
| 9,423,661 B2 | 8/2016 | Jeon et al. |
| 9,588,272 B2 | 3/2017 | Komano et al. |
| 2009/0310336 A1 | 12/2009 | Yoon et al. |
| 2016/0154170 A1 | 6/2016 | Thompson et al. |
| 2019/0025498 A1 | 1/2019 | Kaneki et al. |

*Primary Examiner* — Vip Patel
(74) *Attorney, Agent, or Firm* — Treyz Law Group, P.C.; Joseph F. Guihan

(57) ABSTRACT

A backlight unit may be used to produce backlight illumination for a display. The backlight unit may have a row of light-emitting diodes that are mounted on a flexible printed circuit and that emit light into a light guide layer. The backlight unit may include a chassis that extends around the periphery of the light guide layer. The chassis may have a first portion that is mounted on the flexible printed circuit adjacent to the light-emitting diodes and a second portion that extends over the light-emitting diodes. A heat spreading layer may be attached to a reflector layer and the flexible printed circuit. The heat spreading layer may have a width that is less than the width of the reflector layer. Adhesive patches may attach the light guide layer to the flexible printed circuit. A patterned adhesive layer may be formed over the light-emitting diodes and the light guide layer.

27 Claims, 14 Drawing Sheets

ELECTRONIC DEVICE DISPLAY WITH A BACKLIGHT

This application claims the benefit of provisional patent application No. 62/662,023, filed Apr. 24, 2018, which is hereby incorporated by reference herein in its entirety.

BACKGROUND

This relates generally to electronic devices with displays, and, more particularly, to displays with backlights.

Electronic devices such as computers and cellular telephones have displays. Some displays such organic light-emitting diode displays have arrays of pixels that generate light. In displays of this type, backlighting is not necessary because the pixels themselves produce light. Other displays contain passive pixels that can alter the amount of light that is transmitted through the display to display information for a user. Passive pixels do not produce light themselves, so it is often desirable to provide backlight for a display with passive pixels. Passive pixels may be formed from a layer of liquid crystal material formed between two electrode layers and two polarizer layers.

In a typical backlight assembly for a display, a light guide plate is used to distribute backlight generated by a light source such as a light-emitting diode light source. A reflector may be formed under the light guide plate to improve backlight efficiency.

Conventional backlight assemblies may cause visible artifacts, may not be robust, and may occupy an undesirably large amount of space within an electronic device.

It would therefore be desirable to be able to provide displays with improved backlights.

SUMMARY

A display may have an array of pixels for displaying images for a viewer. The array of pixels may be formed from display layers such as a color filter layer, a liquid crystal layer, a thin-film transistor layer, an upper polarizer layer, and a lower polarizer layer.

A backlight unit may be used to produce backlight illumination for the display. The backlight illumination may pass through the polarizers, the thin-film transistor layer, the liquid crystal layer, and the color filter layer. The backlight unit may have a row of light-emitting diodes that are mounted on a flexible printed circuit board and that emit light into a light guide layer.

The backlight unit may include a chassis that extends around the periphery of the light guide layer. The chassis may have a first portion that is mounted on the flexible printed circuit board adjacent to the row of light-emitting diodes and a second portion that extends over the row of light-emitting diodes. The chassis may have a different cross-sectional shape along the edge adjacent to the light-emitting diodes compared to the remaining edges of the chassis.

A reflector layer may be attached to a lower surface of the light guide layer. A heat spreading layer may be attached to a lower surface of the reflector layer and a lower surface of the flexible printed circuit board. The heat spreading layer may include a sheet of graphite interposed between first and second polymer carrier films. The heat spreading layer may have a width that is less than the width of the reflector layer to mitigate wrinkling of the reflector layer. A strip of adhesive may attach an edge of the heat spreading layer to the flexible printed circuit board. First and second patches of adhesive may attach respective first and second corners of the heat spreading layer to the reflector layer.

A plurality of adhesive patches may attach the lower surface of the light guide layer to the flexible printed circuit board. A patterned layer of adhesive may be formed over the row of light-emitting diodes and the upper surface of the light guide layer. The patterned layer of adhesive may have protruding portions that each extend over a respective one of the plurality of adhesive patches.

DETAILED DESCRIPTION

Figure 1:
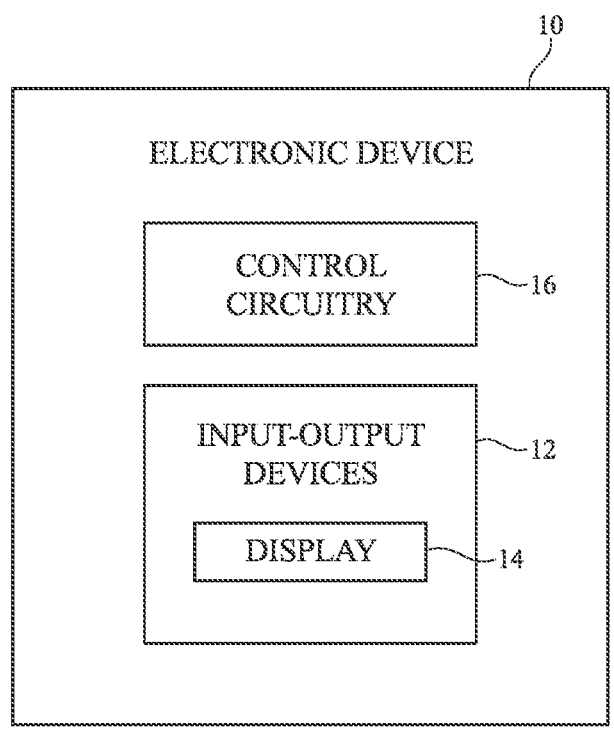
FIG. 1 is a schematic diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Device 10 may be a tablet computer, laptop computer, a desktop computer, a television, a cellular telephone, a media player, a wristwatch device or other wearable electronic equipment, or other suitable electronic device.

Display 14 for device 10 includes an array of pixels. The array of pixels may be formed from liquid crystal display (LCD) components or other suitable display structures. Configurations based on liquid crystal display structures are sometimes described herein as an example.

A display cover layer may cover the surface of display 14 or a display layer such as a color filter layer, thin-film transistor layer, or other portion of a display may be used as the outermost (or nearly outermost) layer in display 14. The outermost display layer may be formed from a transparent glass sheet, a clear plastic layer, or other transparent member.

Figure 2:
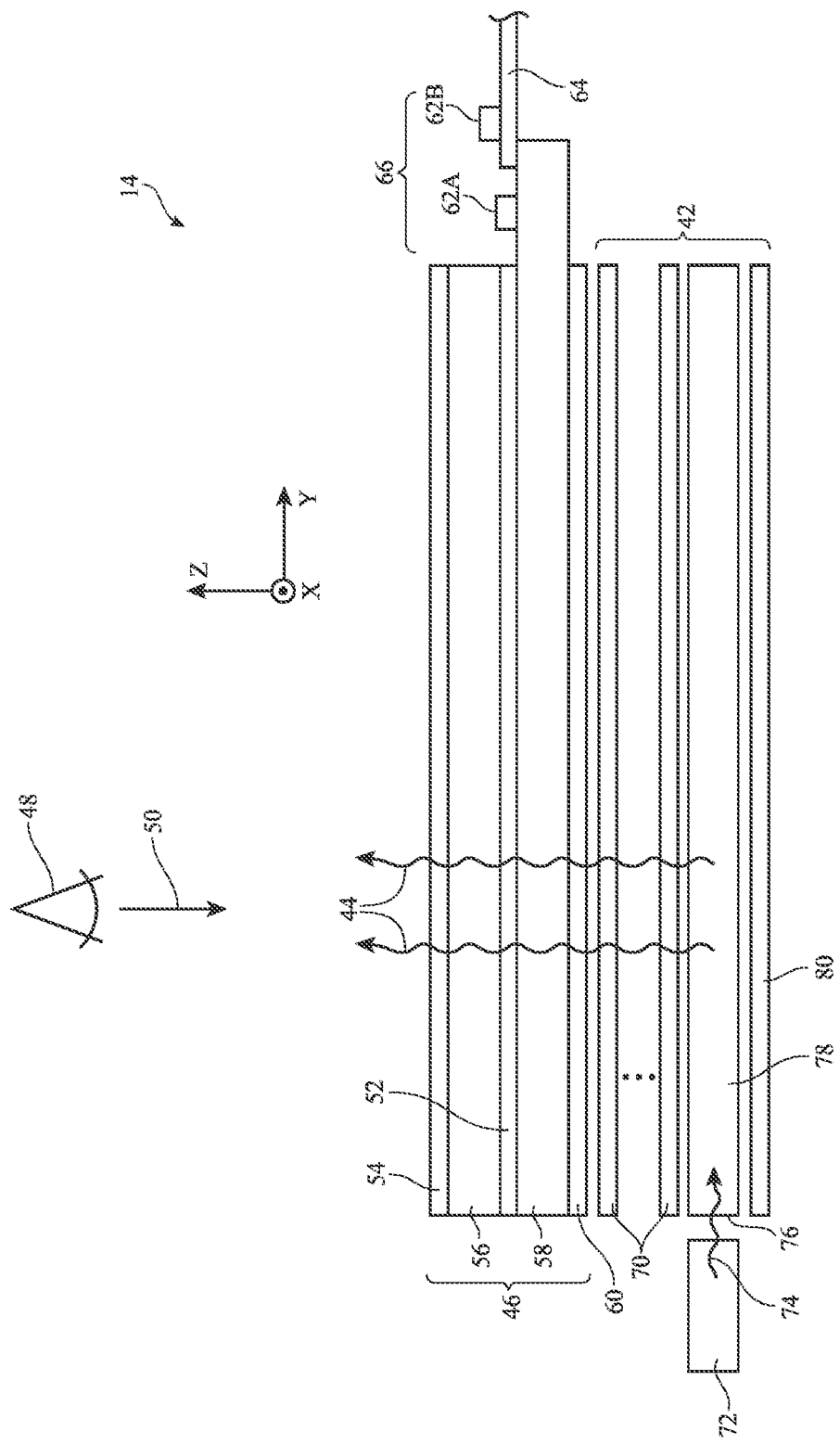
FIG. 2 is a cross-sectional side view of an illustrative display in an electronic device in accordance with an embodiment.

A cross-sectional side view of an illustrative configuration for display 14 of device 10 is shown in FIG. 2. As shown in FIG. 2, display 14 may include a backlight unit such as backlight unit 42 (sometimes referred to as a backlight or backlight structures) for producing backlight 44. During operation, backlight 44 travels outwards (vertically upwards in dimension Z in the orientation of FIG. 2) and passes through pixel structures in display layers 46. This illuminates any images that are being produced by the pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in a housing in device 10 or display layers 46 may be mounted directly in an electronic device housing for device 10 (e.g., by stacking display layers 46 into a recessed portion in a metal or plastic housing). Display layers 46 may form a liquid crystal display or may be used in forming displays of other types.

In a configuration in which display layers 46 are used in forming a liquid crystal display, display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of pixel circuits based on thin-film transistors and associated electrodes (pixel electrodes) for applying electric fields to liquid crystal layer 52 and thereby displaying images on display 14. Layer 56 may be a color filter layer that includes an array of color filter elements for providing display 14 with the ability to display color images. If desired, layer 58 may be a color filter layer and layer 56 may be a thin-film transistor layer. Configurations in which color filter elements are combined with thin-film transistor structures on a common substrate layer may also be used.

During operation of display 14 in device 10, control circuitry (e.g., one or more integrated circuits on a printed circuit) may be used to generate information to be displayed on display 14 (e.g., display data). The information to be displayed may be conveyed to a display driver integrated circuit such as circuit 62A or 62B using a signal path such as a signal path formed from conductive metal traces in a rigid or flexible printed circuit such as printed circuit 64 (as an example). Integrated circuits such as integrated circuit 62A and/or flexible printed circuits such as flexible printed circuit 64 may be attached to substrate 58 in ledge region 66 (as an example).

Backlight structures 42 may include a light guide layer such as light guide layer 78. Light guide layer 78 may be formed from a transparent material such as clear glass or plastic. During operation of backlight structures 42, a light source such as light source 72 may generate light 74. Light source 72 may be, for example, an array of light-emitting diodes (e.g., a series of light-emitting diodes that are arranged in a row that extends into the page in the orientation of FIG. 2). The array of light-emitting diodes may be mounted to a rigid or flexible printed circuit. The printed circuit may be adhered to adjacent layers in the electronic device. In certain embodiments, the printed circuit may be adhered to portions of light guide layer 78.

Light 74 from light source 72 may be coupled into edge surface 76 of light guide layer 78 and may be distributed in dimensions X and Y throughout light guide layer 78 due to the principal of total internal reflection. Light guide layer 78 may include light-scattering features such as pits, bumps, grooves, or ridges that help light exit light guide layer 78 for use as backlight 44. These features may be located on an upper surface and/or on an opposing lower surface of light guide layer 78. With one illustrative configuration, a first surface such as the lower surface of light guide layer 78 has a pattern of bumps and an opposing second surface such as the upper surface of light guide layer 78 has a pattern of ridges (sometimes referred to as lenticules, lenticular structures, or lenticular ridges). Light source 72 may be located at any desired edge of light guide layer 78.

Light 74 that scatters upwards in direction Z from light guide layer 78 may serve as backlight 44 for display 14. Light 74 that scatters downwards may be reflected back in the upward direction by reflector 80. Reflector 80 may be formed from a reflective structure such as a substrate layer of plastic coated with a dielectric mirror formed from alternating high-index-of-refraction and low-index-of-refraction inorganic or organic layers. Reflector 80 may be formed from a reflective material such as a layer of white plastic or other shiny materials.

To enhance backlight performance for backlight structures 42, backlight structures 42 may include optical films 70. Optical films 70 may include diffuser layers for helping to homogenize backlight 44 and thereby reduce hotspots. Optical films 70 may also include brightness enhancement films for collimating backlight 44. Optical films 70 may overlap the other structures in backlight unit 42 such as light guide layer 78 and reflector 80. For example, if light guide layer 78 has a rectangular footprint in the X-Y plane of FIG. 2, optical films 70 and reflector 80 may each have a matching rectangular footprint. Optical films 70 may include compensation films for enhancing off-axis viewing or compensation films may be formed within the polarizer layers of display 14 or elsewhere in display 14.

Figure 3:
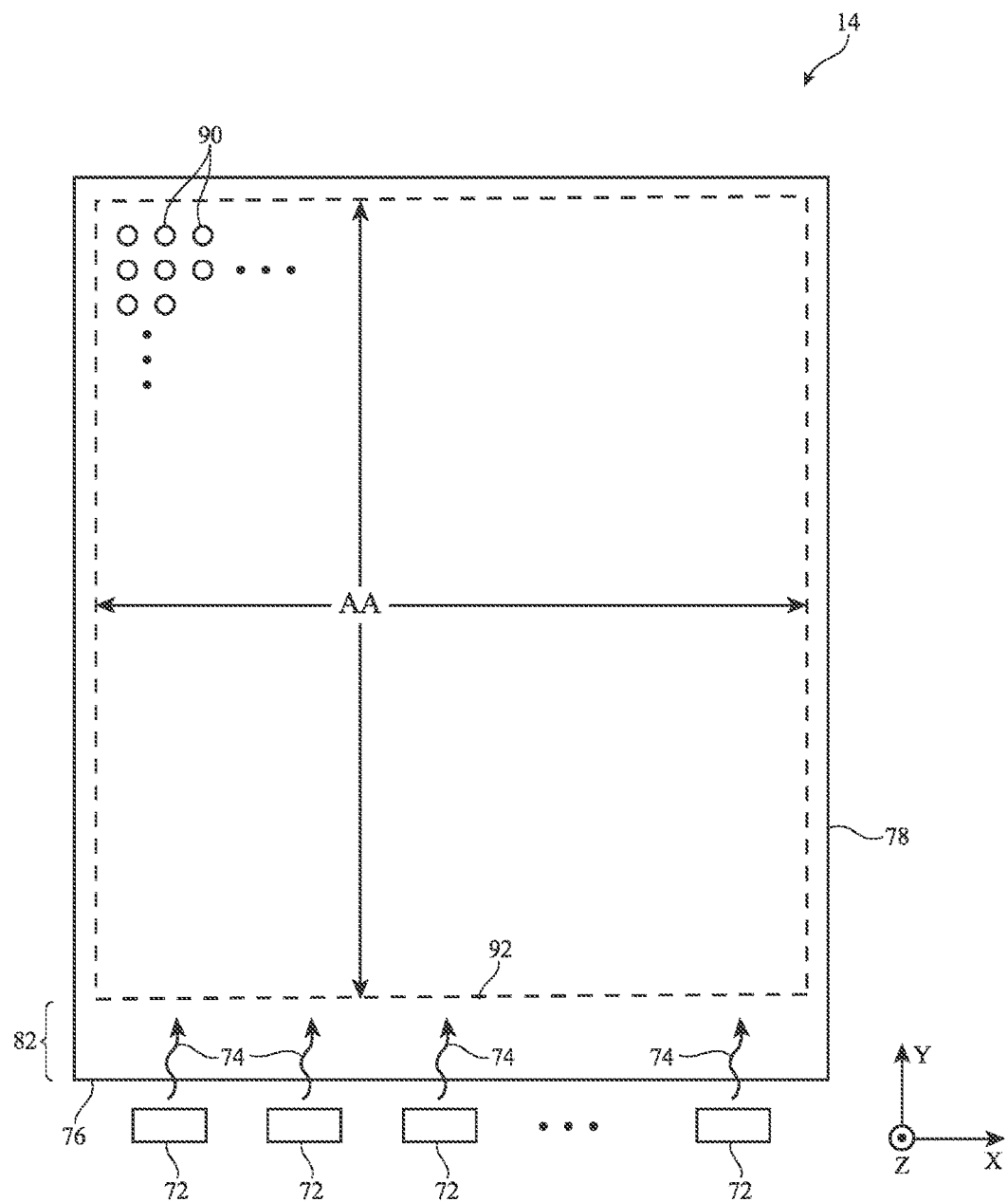
FIG. 3 is a top view of an illustrative display in accordance with an embodiment.

FIG. 3 is a top view of a portion of display 14 showing how display 14 may have an array of pixels 90 formed within display layers 46. Pixels 90 may have color filter elements of different colors such as red color filter elements R, green color filter elements G, and blue color filter elements B. Pixels 90 may be arranged in rows and columns and may form active area AA of display 14. The borders of active area AA may be slightly inboard of the borders of light-guide layer 78 to ensure that there are no visible hotspots in display 14 (i.e., no areas in which the backlight illumination for display 14 is noticeably brighter than surrounding areas). For example, border 92 of active area AA may be offset by a distance 82 from lower edge 76 of light guide layer 78. It is generally desirable to minimize the size of distance 82 so that display 14 is as compact as possible for a given active area size. Nevertheless, distance 82 should not be too small to ensure that there is adequate light mixing. In particular, distance 82 should be sufficiently large to allow light 74 that is emitted from light-emitting diodes 72 to homogenize enough to serve as backlight illumination. Distance 82 is often as long as necessary to ensure light from light-emitting diodes 72 is sufficiently mixed. Accordingly, distance 82 may sometimes be referred to as mixing distance 82. When light 74 is initially emitted from individual light-emitting diodes 72, light 74 is concentrated at the exits of light-emitting diodes 72 and is absent in the spaces between light-emitting diodes 72. After light 74 has propagated sufficiently far within light-guide plate 78 (i.e., after light 74 has traversed a sufficiently large mixing distance 82), light 74 will be smoothly distributed along dimension X and will no longer be concentrated near the exits of respective individual light-emitting diodes 72.

Figure 4:
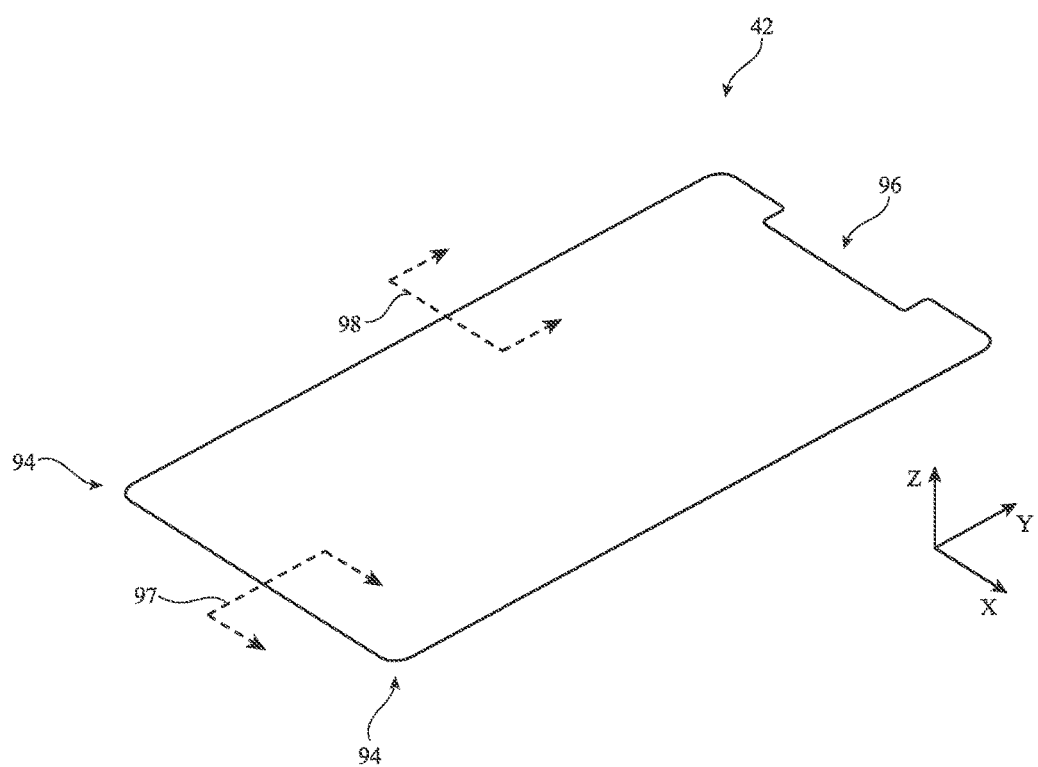
FIG. 4 is a perspective view of illustrative backlight structures with rounded corners and a notch in accordance with an embodiment.
Figure 5:
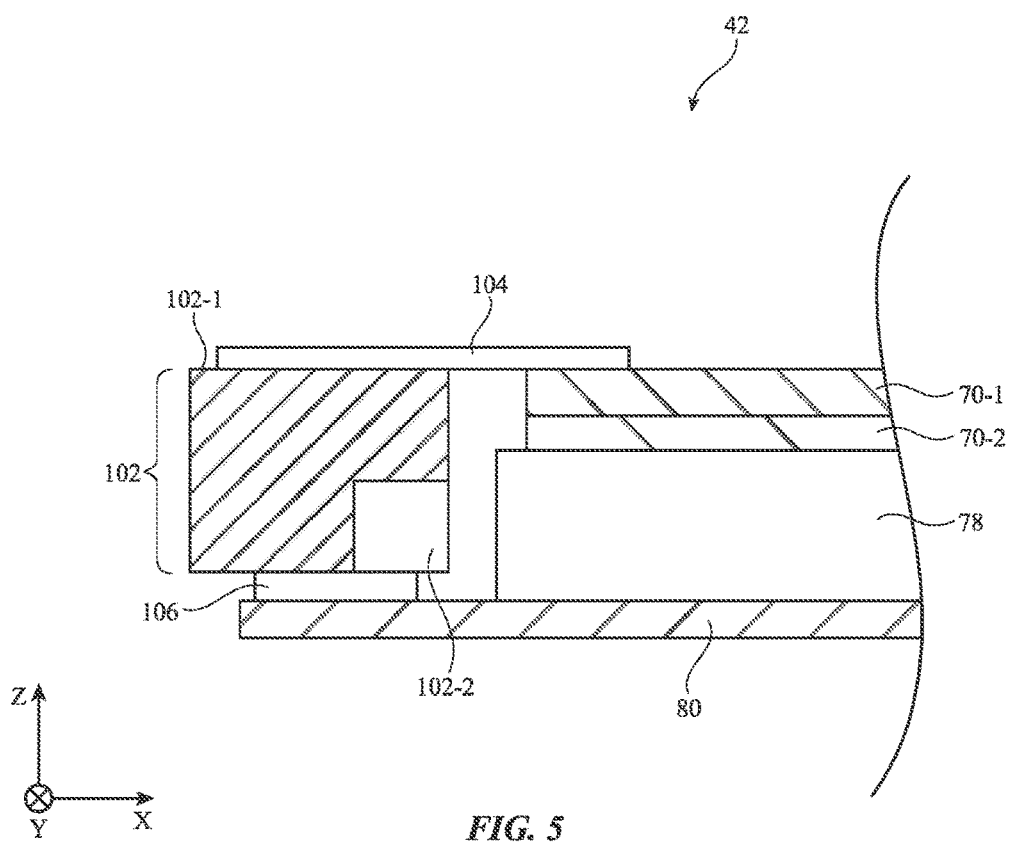
FIG. 5 is a cross-sectional side view of illustrative backlight structures on an edge of the backlight structures that does not include light sources in accordance with an embodiment.
Figure 6:
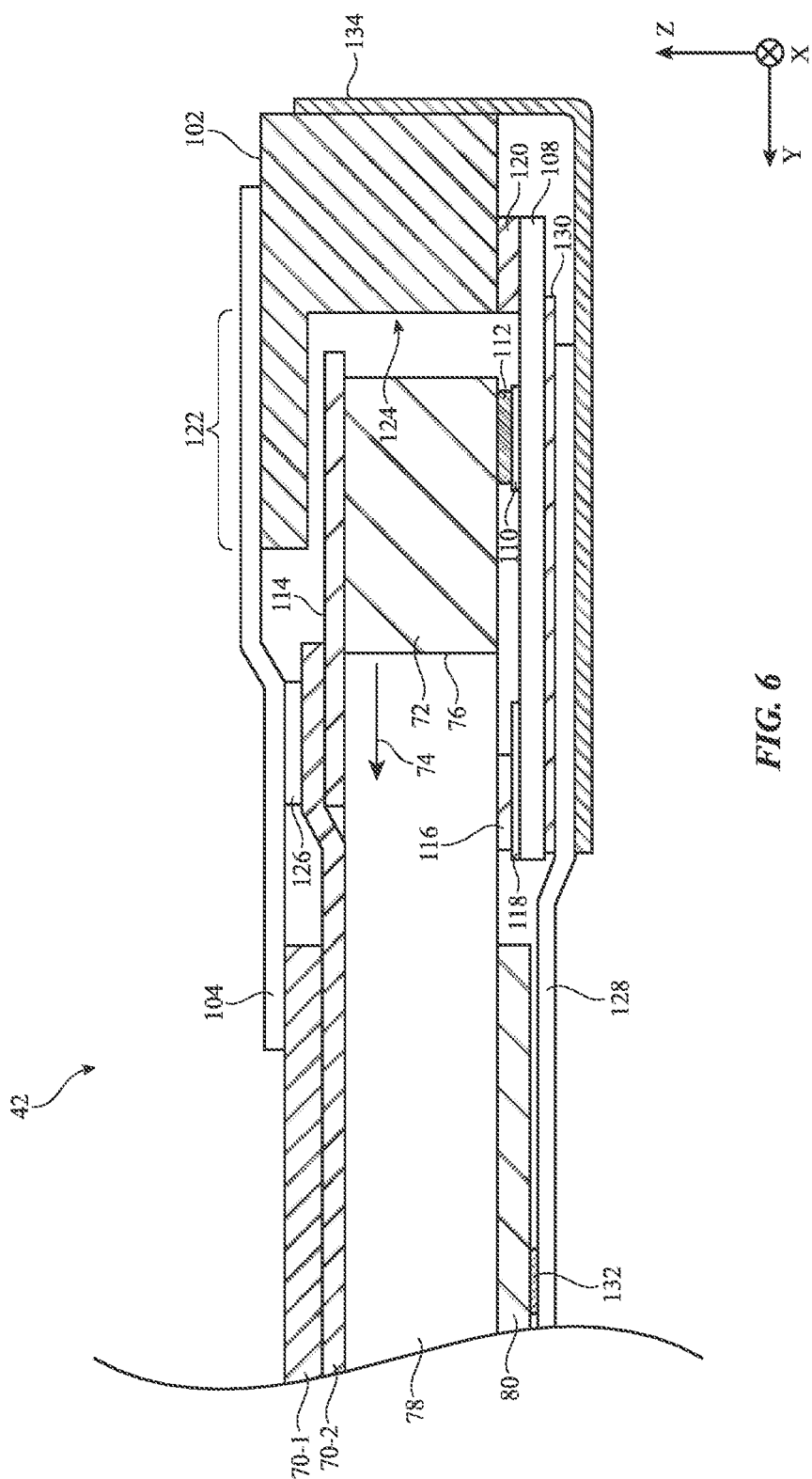
FIG. 6 is a cross-sectional side view of illustrative backlight structures on an edge of the backlight structures that includes light sources in accordance with an embodiment.

The rectangular shape of light guide layer 78 and active area AA in FIG. 3 is merely illustrative. If desired, light guide layer 78 and/or the active area AA may have a non-rectangular shape (e.g., a shape with one or more curved portions). An example of this type is shown in FIG. 4. As shown in FIG. 4, backlight structures 42 (including light guide layer 78) may have rounded corners such as rounded corners 94. Backlight structures 42 may also include a notch such as notch 96 (e.g., to accommodate other components within electronic device 10 such as sensor components). Detailed cross-sections of backlight structures 42 are shown in FIGS. 5 and 6. In particular, FIG. 5 is a cross-sectional side view of backlight structures 42 taken along line 98 in FIG. 4. FIG. 6 is a cross-sectional side view of backlight structures 42 taken along line 97 in FIG. 4.

As shown in FIG. 5, backlight structures 42 include light guide layer 78 and a reflector 80 attached to a lower surface of the light guide layer. Optical films 70-1 and 70-2 may be placed on an upper surface of the light guide layer. Optical film 70-1 may be a brightness enhancement film (BEF) or another desired type of optical film. Optical film 70-2 may be a diffuser layer (for helping to homogenize backlight) or another desired type of optical film.

Backlight structures 42 also include chassis 102. Chassis 102 may be a plastic chassis (sometimes referred to as a p-chassis) that supports other layers (e.g., layers in backlight structures 42 and/or display layers 46) in the display. Chassis 102 may extend around the periphery of light guide layer 78 with a central opening in which the light guide layer 78 is positioned (e.g., chassis 102 may be ring-shaped). If desired, chassis 102 may be formed from two or more types of material. In the example of FIG. 5, chassis 102 is formed from a first shot of molded plastic 102-1 and a second shot of molded plastic 102-2. The first shot of molded plastic may have a darker color than the second shot of molded plastic (e.g., plastic 102-1 may be black and plastic 102-2 may be white). The second shot of molded plastic 102-2 may be positioned adjacent the edge of light guide layer 78 such that the second shot of molded plastic reflects light back into the light guide layer. This example is merely illustrative and chassis 102 may be formed from a single dielectric material if desired.

Adhesive layer 104 may be attached to a top surface of chassis 102 and a top surface of optical film 70-1. Adhesive layer 104 may extend around the periphery of light guide layer 78 and may have a central opening (e.g., adhesive layer 104 may be ring-shaped). Adhesive layer 104 may therefore sometimes be referred to as ring tape. Ring tape 104 may attach backlight structures 42 to display layers 46 if desired. Another adhesive layer 106 may attach a lower surface of chassis 102 to reflector layer 80. Adhesive layers 104 and 106 may be pressure sensitive adhesive layers or any other desired type of adhesive layers.

The three edges of backlight structures 42 that do not include light-emitting diodes 72 may have cross-sections of the type shown in FIG. 5. For example, looking at FIG. 3, light-emitting diodes 72 are positioned along a lower edge of the light guide layer. The lower edge of the backlight structures has a different arrangement than the remaining three edges of the backlight structures. The remaining three edges of the backlight structures may have an arrangement of the type shown in FIG. 5.

FIG. 6 is a cross-sectional side view of the lower edge of the backlight structures where the light sources emit light into the light guide layer. As shown in FIG. 6, this portion of the backlight structures still includes light guide layer 78, a reflector layer 80 attached to a lower surface of the light guide layer, an optical film such as diffuser layer 70-2 attached to an upper surface of the light guide layer, and an optical film such as brightness enhancement film 70-1 attached to an upper surface of optical film 70-2. However, light sources 72 may be included to emit light 74 in the Y-direction through edge surface 76 of the light guide layer.

Light sources 72 may be light-emitting diodes that are arranged in a row along the edge surface 76 of the light guide layer. Each light-emitting diode 72 may be mounted on a printed circuit board such as flexible printed circuit board 108. Flexible printed circuit board 108 may be a printed circuit formed from sheets of polyimide or other flexible polymer layers. Flexible printed circuit board 108 (sometimes referred to as flexible printed circuit 108 or printed circuit 108) may include patterned metal traces for carrying signals between components on the flexible printed circuit board. Flexible printed circuit board 108 may include contact pads 110 (sometimes referred to as solder pads 110). Solder pads 110 may be conductive (e.g., metal) pads formed on the upper surface of flexible printed circuit board 108. Solder 112 may couple the light-emitting diodes 72 to solder pads 110. Each light-emitting diode (sometimes referred to as a light-emitting diode package) may have one or more associated solder pads. The solder may electrically and mechanically connect the light-emitting diodes to flexible printed circuit board 108.

In addition to being attached to flexible printed circuit board 108 by solder 112, light-emitting diodes 72 may be attached to light guide layer 78 by adhesive layer 114. As shown in FIG. 6, adhesive layer 114 is positioned on an upper surface of light-emitting diodes 72 and extends over the upper surface of light guide layer 78. A portion of adhesive layer 114 is interposed between light guide layer 78 and optical film 70-2. Adhesive layer 114 may be a pressure sensitive adhesive layer or any other desired type of adhesive layer.

Flexible printed circuit board 108 is coupled to light-emitting diodes by solder 112. Flexible printed circuit board 108 may also be coupled to light guide layer 78 by an additional adhesive layer. As shown in FIG. 6, flexible printed circuit board 108 may include a coating layer 118 (sometimes referred to as a coverlay) and an adhesive layer 116 that is attached between light guide layer 78 and coating 118. If desired, coating 118 may be omitted and adhesive layer 116 may attach light guide layer 78 directly to the flexible printed circuit board. Adhesive layer 116 may be a pressure sensitive adhesive layer or any other desired type of adhesive layer. Flexible printed circuit board 108 may also be attached to chassis 102 by an adhesive layer such as adhesive layer 120. Adhesive layer 120 may be a pressure sensitive adhesive layer or any other desired type of adhesive layer.

Chassis 102 in FIG. 6 is the same chassis as the chassis shown in FIG. 5. However, chassis 102 has a different cross-section on the lower edge of the backlight structures than the other three edges of the backlight structures. As shown in FIG. 6, chassis 102 has an overhang portion 122 that extends away from a main body portion 124 of the chassis. Main body portion 124 of the chassis is positioned adjacent to light-emitting diodes 72 and is attached to flexible printed circuit board 108. Overhang portion 122 (sometimes referred to as an extension or a protrusion) extends over light-emitting diodes 72. The overhang portion increases the surface area of the upper surface of chassis 102, allowing a greater contact area with ring tape 104 (without increasing the width of the inactive area of the display). Chassis 102 may be said to have an L-shape along the lower edge of the backlight.

Ring tape 104 may be attached between an upper surface of optical film 70-1 and an upper surface of chassis 102. A spacer such as spacer 126 (sometimes referred to as spacer structures 126) may be included between optical film 70-2 and ring tape 104 to help reduce bending in the ring tape. The spacer may also provide an additional surface for the ring tape to be attached, increasing the strength of the attachment of the ring tape. Spacer 126 may be formed from any desired material.

During operation of device 10, light-emitting diodes and other components within the device produce heat. A heat spreading layer may be included in the device to spread the heat within device 10 to avoid creating thermal hotspots (which may cause visible artifacts). FIG. 6 shows an example where backlight structures 42 include a heat spreading layer 128 to spread heat that is emitted from components such as light-emitting diodes 72. In the example of FIG. 6, heat spreading layer 128 lies in the X-Y plane and spreads heat laterally in dimensions X and Y. Heat spreading layer 128 may optionally be coupled to an additional thermally conductive component within device 10 (e.g., a metal housing midplate) for additional heat dissipation. Heat spreading layer 128 may be formed from any suitable material that has a high thermal conductivity and can therefore serve to spread heat. Examples of materials that may be used for forming heat spreading layer 128 include metal (e.g., copper, other metals, or combinations of copper and other metals), carbon nanotubes, graphite, or other materials that exhibit high thermal conductivity. If desired, heat spreading layer 128 may be formed from two or more thermally conductive layers of different types (e.g., a layer of copper attached to a layer of graphite, etc.). Polymer carrier films may also be incorporated in layer 128 (e.g., to support a layer of graphite). In one illustrative example, heat spreading layer 128 includes a layer of graphite interposed between two polymer carrier films.

Heat spreading layer 128 may be attached to a lower surface of flexible printed circuit 108 by adhesive layer 130. Adhesive layer 130 may be a pressure sensitive adhesive layer or any other desired type of adhesive layer. Backlight structures 42 may also include one or more additional adhesive layers such as adhesive layer 132 that attach heat spreading layer 128 directly to reflector layer 80. Adhesive layer 132 may be a pressure sensitive adhesive layer or any other desired type of adhesive layer.

Backlight structures 42 may also include light shield tape 134 (sometimes referred to as opaque adhesive layer 134). Light shield tape 134 may be formed from an opaque material that allows the light shield tape to block stray light. Additionally, the light shield tape may help hold chassis 102 and flexible printed circuit board 108 together. As shown in FIG. 6, light shield tape 134 is coupled between a side surface of chassis 102 and a lower surface of heat spreading layer 128. This may help secure printed circuit board 108 and chassis 102 in their desired positions (in addition to blocking stray light).

As discussed in connection with FIG. 6, a heat spreading layer (128) in backlight structures 42 may be attached directly to reflector layer 80. However, differences in thermal conductivities of reflector layer 80 and heat spreading layer 128 may cause reflector layer 80 to wrinkle at certain temperatures. These wrinkles in reflector layer 80 may cause visible artifacts in the displayed light.

Figure 7:
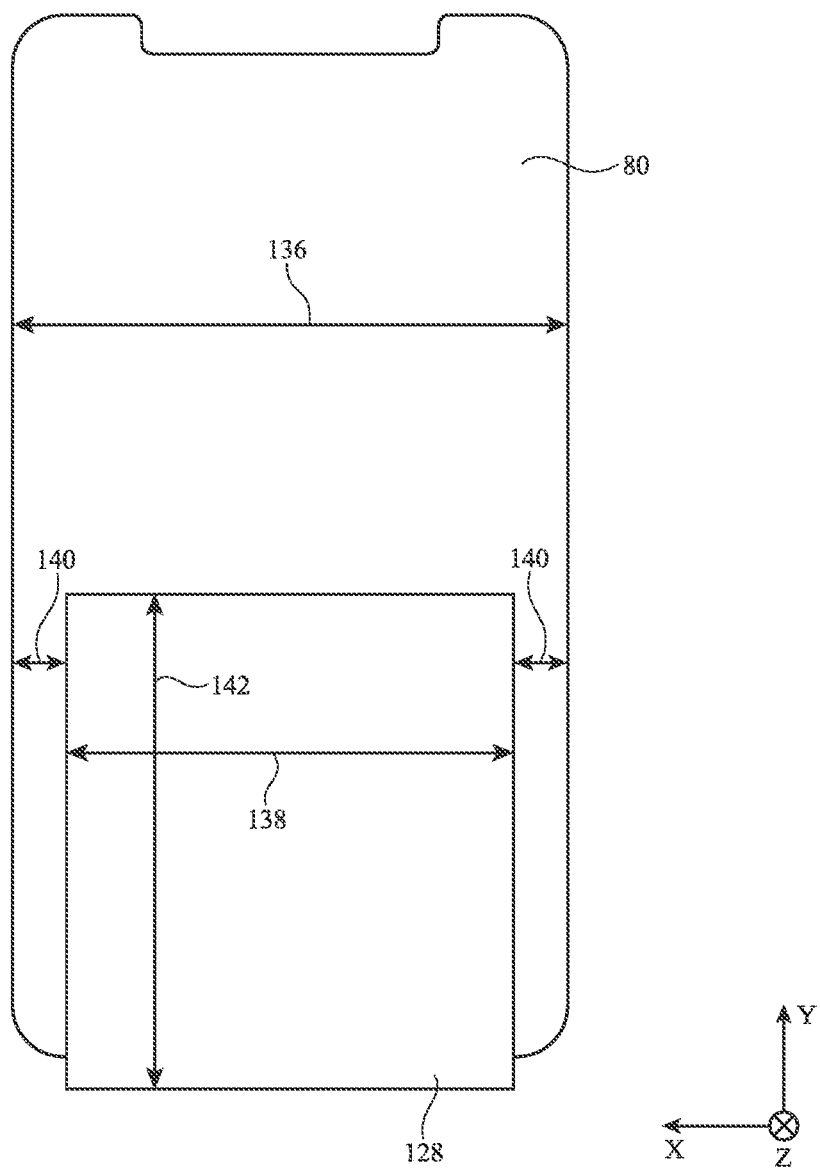
FIG. 7 is a rear view of an illustrative heat spreading layer showing how the heat spreading layer may have a reduced width relative to the reflector layer in accordance with an embodiment.

FIG. 7 shows a rear view of heat spreading layer 128 and reflector layer 80 in an arrangement that reduces wrinkling in reflector layer 80. As shown in FIG. 7, reflector layer 80 may have a width 136. Width 136 may be any desired distance (e.g., between 60 and 70 millimeters, between 50 and 100 millimeters, between 65 and 70 millimeters, less than 100 millimeters, greater than 40 millimeters, etc.). Heat spreading layer 128 may have a width 138 that is less than width 136. Width 138 may be any desired distance (e.g., between 55 and 65 millimeters, between 50 and 100 millimeters, between 55 and 60 millimeters, less than 100 millimeters, greater than 40 millimeters, etc.). Each edge of the heat spreading layer may be separated from the edge of the reflector layer by a distance such as distance 140. Distance 140 may be the same on each side of the heat spreading layer or may be different on each side of the heat spreading layer. Distance 140 may be any desired distance (e.g., between 2 and 10 millimeters, between 3 and 5 millimeters, less than 20 millimeters, greater than 1 millimeter, etc.). Having gaps 140 between the edges of the heat spreading layer and the edges of the reflector layer may prevent wrinkling of the reflector layer, thereby improving display performance. The length 142 of heat spreading layer 128 may be any desired length (e.g., between 50 and 100 millimeters, between 25 and 200 millimeters, less than 100 millimeters, less than 200 millimeters, greater than 40 millimeters, greater than 10 millimeters etc.).

Figure 8:
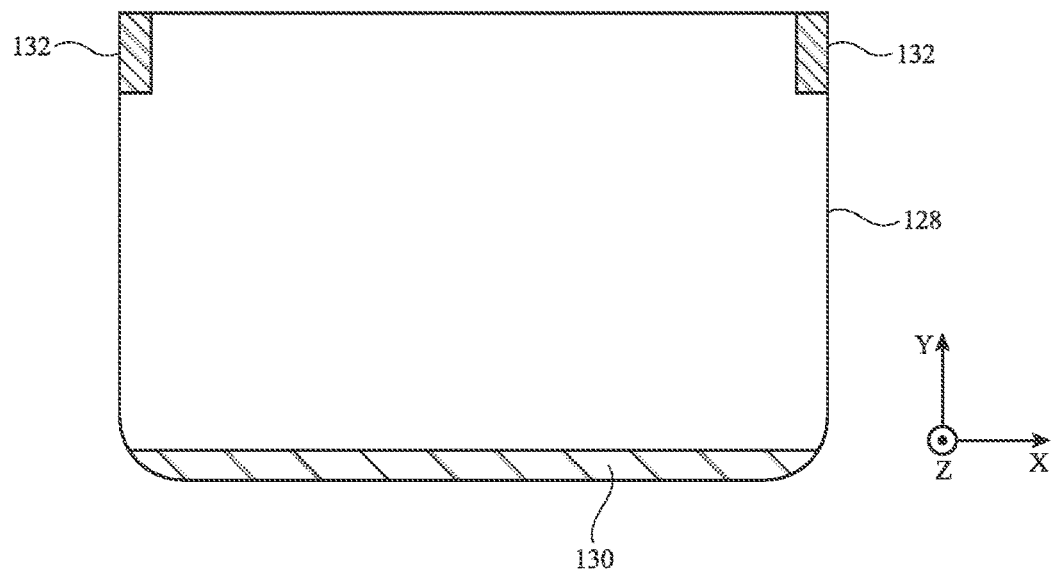
FIG. 8 is a top view of an illustrative heat spreading layer showing how adhesive may be patterned on the heat spreading layer in accordance with an embodiment.

The position of the adhesive that attaches heat spreading layer 128 to the other backlight structures (e.g., the reflector layer and flexible printed circuit board) may also influence wrinkling of the reflector layer. As previously shown in connection with FIG. 6, an adhesive layer 130 may attach an upper surface of the heat spreading layer to a lower surface of the flexible printed circuit board. Additional adhesive layers 132 may attach the upper surface of the heat spreading layer to a lower surface of the reflector layer. FIG. 8 shows an arrangement for adhesive layers 130 and 132 to minimize wrinkling of the reflector layer.

FIG. 8 is a top view of heat spreading layer 128 and corresponding adhesive layers. As shown in FIG. 8, adhesive layer 130 between heat spreading layer 128 and the flexible printed circuit board (108) may be formed as a strip along the lower edge of heat spreading layer 128. Two separate adhesive layers 132 may be formed between heat spreading layer 128 and the reflector layer (80). One of the adhesive layers 132 is attached to the upper-left corner of the heat spreading layer and one of the adhesive layers 132 is attached to the upper-right corner of the heat spreading layer. In other words, the heat spreading layer has first and second opposing edges connected by third and fourth opposing edges. A first strip of adhesive is formed along the first edge of the heat spreading layer and attaches the heat spreading layer to the flexible printed circuit board. A first patch of adhesive that attaches the heat spreading layer to the reflector layer is formed in the corner of the heat spreading layer where the second and third edges of the heat spreading layer meet. A second patch of adhesive that attaches the heat spreading layer to the reflector layer is formed in the corner of the heat spreading layer where the second and fourth edges of the heat spreading layer meet.

Figure 9:
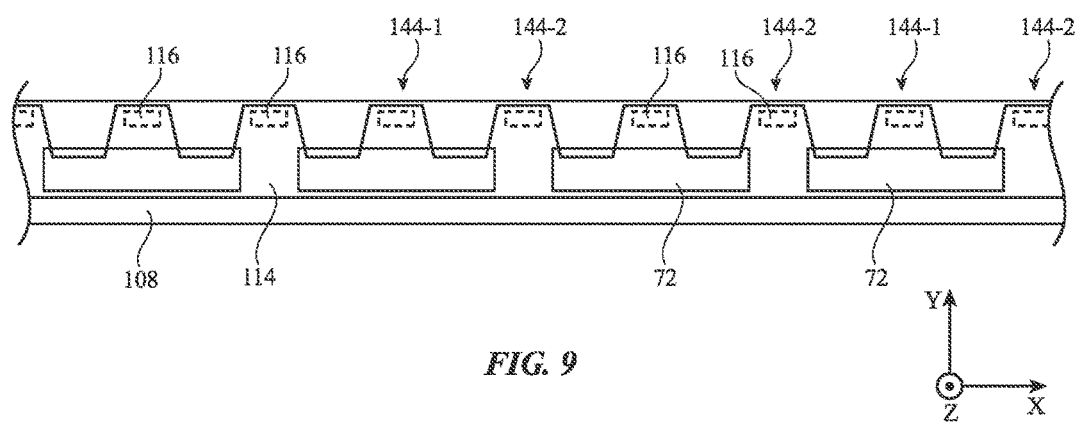
FIG. 9 is a top view of illustrative backlight structures showing how adhesive may be patterned on an upper surface of the light-emitting diodes and light guide layer and a lower surface of the light guide layer in accordance with an embodiment.

As previously shown in connection with FIG. 6, an adhesive layer 114 may attach an upper surface of light-emitting diodes 72 to an upper surface of light guide layer 78 and an adhesive layer 116 may attach a lower surface of light guide layer 78 to flexible printed circuit board 108. FIG. 9 is a top view showing how adhesive layers 114 and 116 may be patterned. The pattern of adhesive shown in FIG. 9 may help optimize the mechanical and optical characteristics of the backlight.

As shown in FIG. 9, light-emitting diodes 72 may be mounted on flexible printed circuit 108. Adhesive layer 114 may be formed over the upper surfaces of light-emitting diodes 72. Each light-emitting diode may have two respective light-emitting portions. Adhesive layer may have protruding portions 144 that are interposed between each set of adjacent light-emitting portions in the light-emitting diodes. For example, a first set of protruding portions 144-1 are positioned in the middle of each light-emitting diode. A second set of protruding portions 144-2 are positioned between each adjacent pair of light-emitting diodes. Each protruding portion in the first set combines with a protruding portion in the second set to define an adhesive-free area that coincides with a light-emitting portion of one of the light-emitting diodes. The protruding portions of adhesive layer 114 may extend over and contact the upper surface of light guide layer 78.

Adhesive layer 116 may include a number of patches of adhesive (sometimes referred to as islands of adhesive). Each adhesive patch 116 is coupled between the lower surface of light guide layer 78 and the flexible printed circuit board 108. As shown in FIG. 9, each patch of adhesive 116 is also overlapped by a respective protruding portion 144 of adhesive layer 114. In other words, for each adhesive patch 116, a line parallel to the Z-axis can be drawn that runs through that adhesive patch and a respective protruding portion 144. This example is merely illustrative, and other adhesive arrangements may be used if desired.

Figure 10:
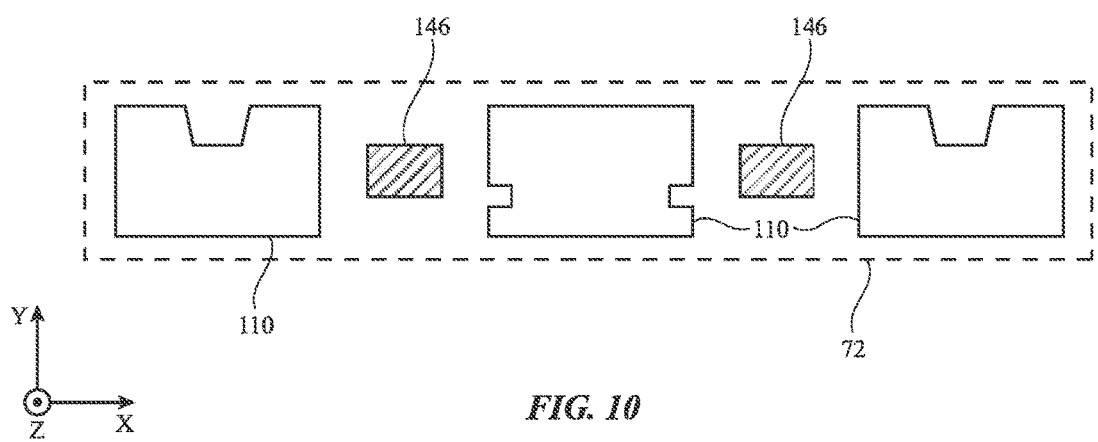
FIG. 10 is a top view of an illustrative light-emitting diode with adhesive patches interposed between adjacent solder pads in accordance with an embodiment.

As discussed in connection with FIG. 6, light-emitting diodes 72 may be attached to flexible printed circuit board 108 using solder 112. FIG. 10 is a top view showing how the light-emitting diodes may be attached to the flexible printed circuit board. As shown in FIG. 10, a given light-emitting diode 72 may overlap three solder pads 110. Each solder pad may have one or more notches to improve alignment of the light-emitting diode if desired. Each solder pad may have corresponding solder that is attached between the solder pad and the light-emitting diode.

In addition to using solder between the light-emitting diode and the contact pads, adhesive 146 may be used to attach light-emitting diodes to the flexible printed circuit board. Adhesive patches 146 (sometimes referred to as glue patches 146) may be interposed between each pair of adjacent solder pads. The adhesive patches may adhere the light-emitting diode directly to the flexible printed circuit board (e.g., without an intervening solder pad). The adhesive patches (e.g., underfill) may be added after the light-emitting diode is attached to the solder pads using solder. In this case, the adhesive patches 146 may improve the mechanical strength of the attachment between the light-emitting diode and the flexible printed circuit board. Alternatively, the adhesive patches may be deposited on the flexible printed circuit board before the light-emitting diode is placed on the flexible printed circuit board. In this case, the adhesive patches may improve alignment of the light-emitting diodes in addition to increasing the mechanical strength of the attachment. Adhesive patches 146 may be any desired type of adhesive (e.g., pressure sensitive adhesive, hot melt adhesive, etc.) and may be formed from any desired type of material (e.g., polymer).

Figure 11:
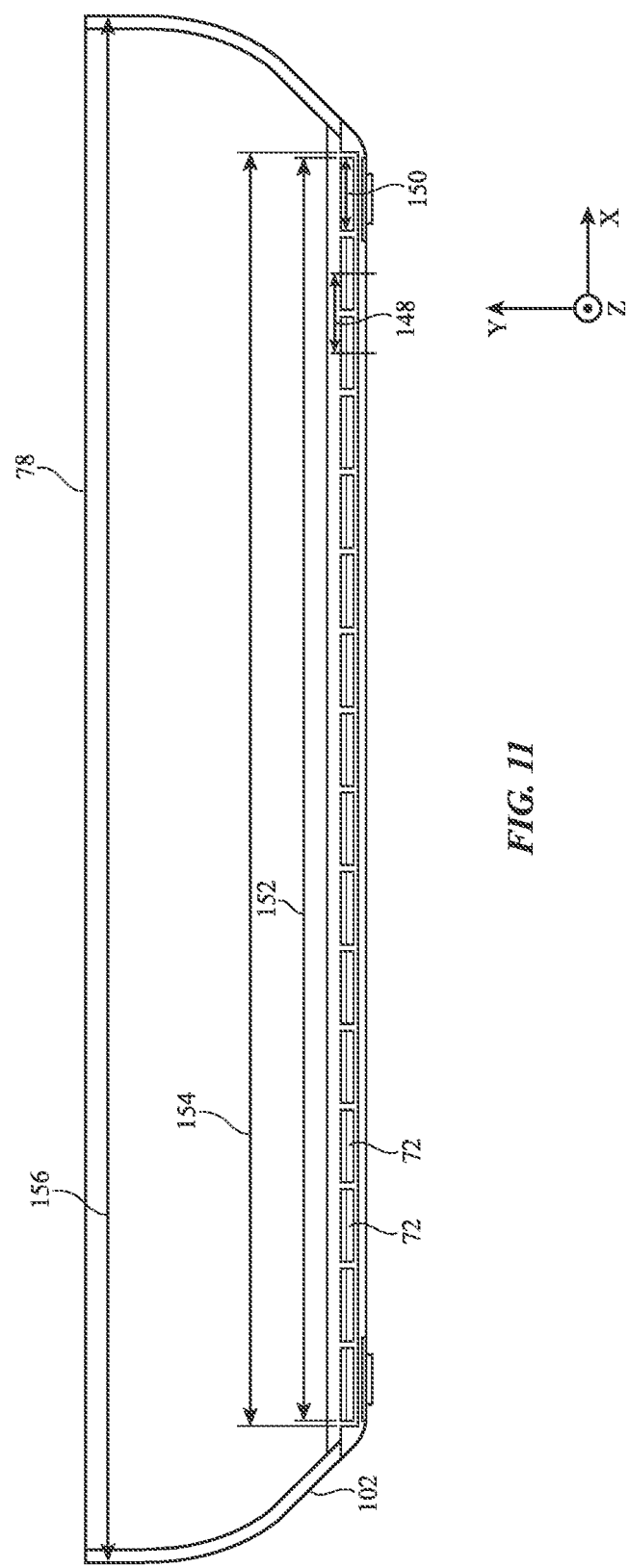
FIG. 11 is a top view of illustrative backlight structures showing an arrangement for a light-emitting diode array in accordance with an embodiment.

FIG. 11 is a top view of an illustrative arrangement for light-emitting diodes 72 to allow the light-emitting diodes to emit light into light guide layer 78 having rounded corners. As shown in FIG. 11, there may be sixteen light-emitting diodes positioned in a row adjacent to the lower edge of light guide layer 78. Each light-emitting diode may have two light-emitting areas. This example is merely illustrative. In general, backlight structures 42 may include any desired number of light-emitting diodes (e.g. more than eight, more than ten, more than fifteen, less than twenty, less than twelve, less than thirty, etc.) and each light-emitting diode may have any desired number of light-emitting areas (one, two, three, more than three, etc.).

Each light-emitting diode may have a width 150. Width 150 may be any desired distance (e.g., between 3 and 4 millimeters, between 2 and 10 millimeters, greater than 1 millimeter, less than 10 millimeters, etc.). The centers of adjacent light-emitting diodes may be separated by pitch 148. Pitch 148 may be any desired distance (e.g., between 3 and 4 millimeters, between 2 and 10 millimeters, greater than 1 millimeter, less than 10 millimeters, etc.). The light-emitting diode array may have a total overall length 152 (e.g., between 50 and 65 millimeters, between 40 and 100 millimeters, between 50 and 55 millimeters, less than 100 millimeters, greater than 30 millimeters, etc.). The light-emitting diodes may be positioned in an opening in chassis 102 (e.g., a portion of chassis 102 having overhang 122 shown in FIG. 6) that has a width 154 (e.g., between 50 and 65 millimeters, between 40 and 100 millimeters, between 50 and 60 millimeters, less than 100 millimeters, greater than 30 millimeters, etc.). Chassis 102 may have a maximum width 156 (e.g., between 55 and 75 millimeters, between 40 and 100 millimeters, between 60 and 70 millimeters, less than 100 millimeters, greater than 30 millimeters, etc.).

The light-emitting diode arrangement of FIG. 11 is merely illustrative. In an alternate embodiment, there may be fourteen light-emitting diodes that have two light-emitting areas and four light-emitting diodes that have single light-emitting areas. Two light-emitting diodes with single light-emitting areas may be positioned on both sides of the fourteen light-emitting diodes that have two light-emitting areas.

Figure 12:
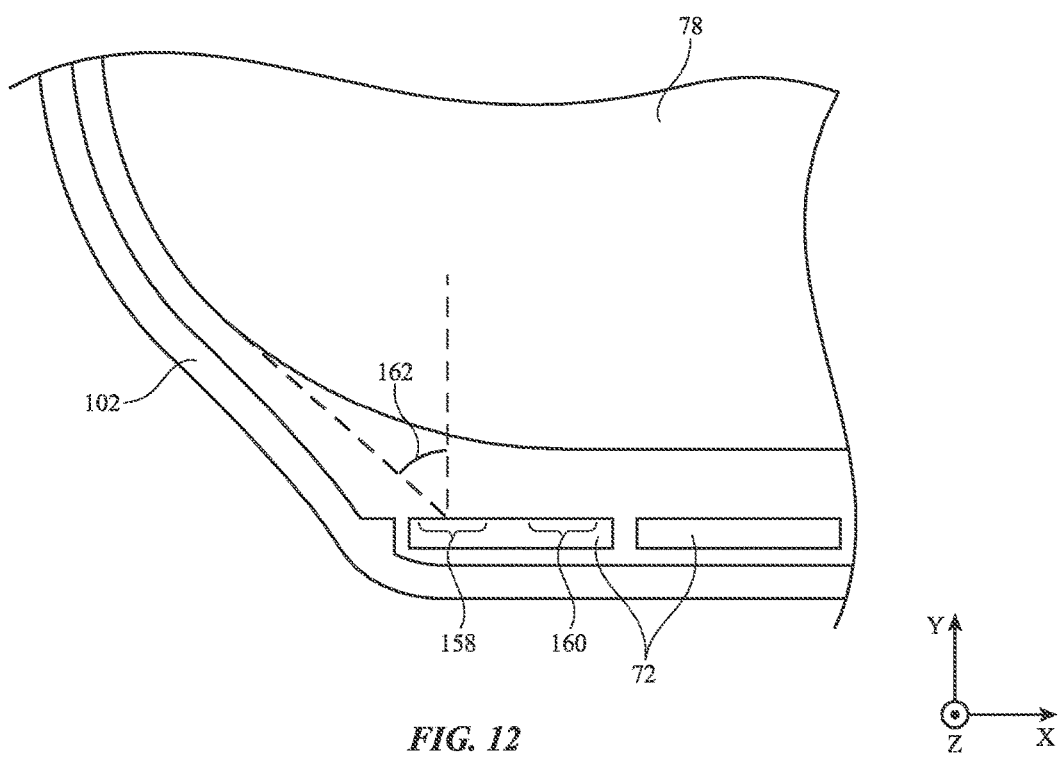
FIG. 12 is a top view of illustrative backlight structures showing how light from a light-emitting area of a light-emitting diode may be emitted an angle to fill rounded corners of the light guide layer in accordance with an embodiment.

FIG. 12 is a top view of light-emitting diodes at the edge of the light-emitting diode array showing how light may be emitted to fill the corners of light guide layer 78. As shown in FIG. 12, each light-emitting diode 72 may have two light-emitting areas (e.g., a first light-emitting area 158 and a second light-emitting area 160). To ensure that light reaches the rounded corners of light guide layer 78, light from light-emitting area 158 may be emitted with an angle 162 relative to the Y-axis (e.g., the cone of light emitted by light-emitting area 158 has an outermost edge at angle 158 relative to the Y-axis). Angle 162 may be selected to ensure light reaches all portions of light guide layer 78. Angle 162 may be 55°, between 50° and 60°, between 540 and 56°, between 40° and 70°, between 30° and 80°, less than 80°, less than 60°, less than 45°, greater than 30°, greater than 50°, greater than 65°, or any other desired angle.

FIGS. 5 and 6 showed ring tape 104 that has a lower surface attached to the upper surface of chassis 102 and the upper surface of optical film 70-1. As previously mentioned, the upper surface of ring tape 104 may be attached to a layer of display layers 46 or another desired device component. Additionally, the ring tape may extend around the periphery of light guide layer 78 and have a central opening. If ring tape 104 extends entirely around the light guide layer, thus forming a seal around the entire light guide layer, the backlight structures and display structures may be susceptible to damage during a drop event (because air has nowhere to escape if compressed and instead deforms layers in the device). Accordingly, an opening may be formed in ring tape 104, as shown in FIG. 13.

Figure 14:
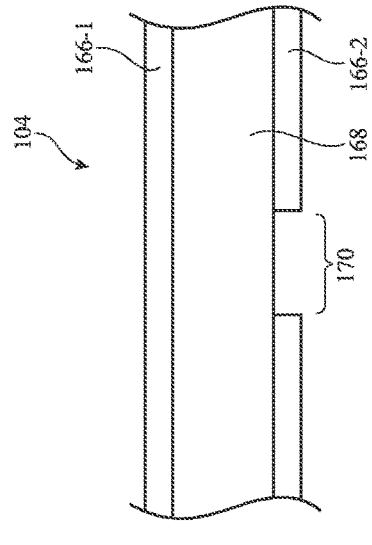
FIG. 14 is a cross-sectional side view of illustrative ring tape having a cut-out through only one of its layers in accordance with an embodiment.
Figure 13:
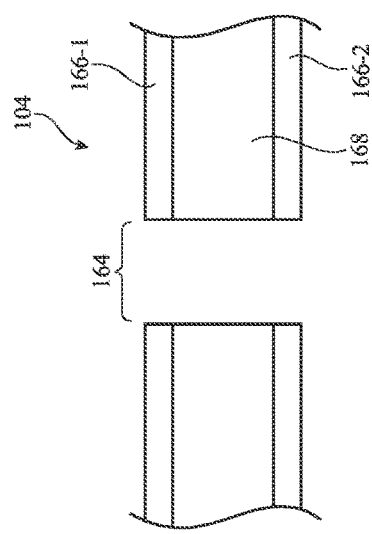
FIG. 13 is a cross-sectional side view of illustrative ring tape having a cut-out through all of its layers in accordance with an embodiment.

FIG. 13 is a cross-sectional side view of ring tape 104 that has a cut-out 164 through all of its layers. As shown, ring tape 104 is formed from a polymer film 168 that is interposed between an upper adhesive layer 166-1 (e.g., pressure sensitive adhesive or another desired type of adhesive) and a lower adhesive layer 166-2 (e.g., pressure sensitive adhesive or another desired type of adhesive). In FIG. 13, cut-out 164 passes through all of the layers of the ring tape. While preventing damage caused by a seal formed by the ring tape, the cut-out 164 in FIG. 13 may cause visible artifacts during operation of the display. Alternate embodiments for cut-out 164 that provide an opening for air without causing visible artifacts are shown in FIG. 14-16.

In the cross-sectional side view of FIG. 14, ring tape 104 again has a polymer film 168 interposed between pressure sensitive adhesive layers 166-1 and 166-2. However, the ring tape of FIG. 14 has a cut-out 170 formed only in adhesive layer 166-2. Polymer film 168 and adhesive layer 166-1 are left un-cut. This provides an air opening without causing visible artifacts.

Figure 15:
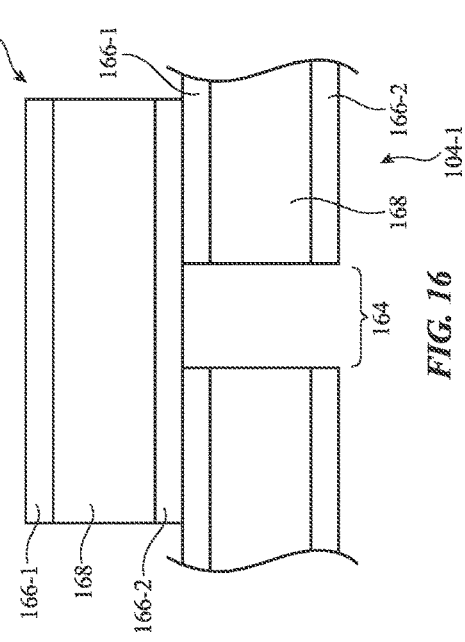
FIG. 15 is a cross-sectional side view of illustrative ring tape having a second piece of ring tape fill a cut-out in accordance with an embodiment.

FIG. 15 is a cross-sectional side view of an embodiment where first and second types of ring tape are used. Ring tape 104-1 having a polymer film 168 interposed between pressure sensitive adhesive layers 166-1 and 166-2 may be cut to form a cut-out 164. In cut-out 164, ring tape 104-2 that is different than ring tape 104-1 is formed. Ring tape 104-2 may, for example, have only a polymer film 174 and an adhesive layer 172. An opening may be formed underneath polymer film 174. Ring tape 104-1 and 104-2 may be formed from different materials if desired.

Figure 16:
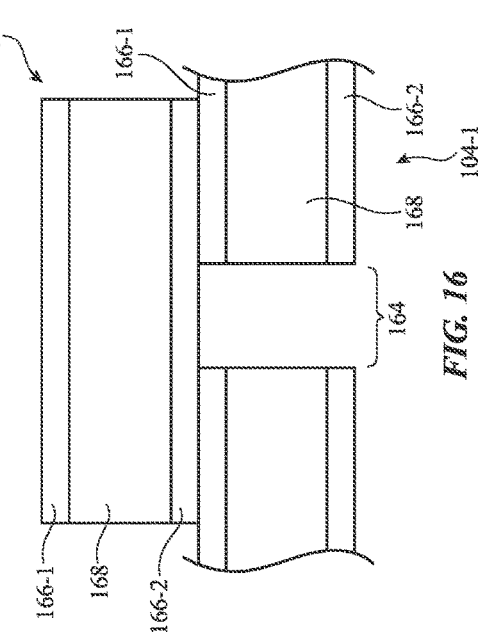
FIG. 16 is a cross-sectional side view of illustrative ring tape having a second piece of ring tape overlap a cut-out in accordance with an embodiment.

FIG. 16 is a cross-sectional side view of ring tape 104-1 that has a cut-out 164 through all of its layers. As shown, ring tape 104-1 is formed from a polymer film 168 that is interposed between an upper adhesive layer 166-1 and a lower adhesive layer 166-2. In FIG. 16, cut-out 164 passes through all of the layers of ring tape 104-1. A second piece of ring tape 104-2 is formed over cut-out 164 and bridges cut-out 164. In FIG. 16, ring tape 104-2 is also formed from a polymer film 168 that is interposed between an upper adhesive layer 166-1 and a lower adhesive layer 166-2. However, ring tape 104-1 and 104-2 may be formed from different materials if desired.

Figure 17:
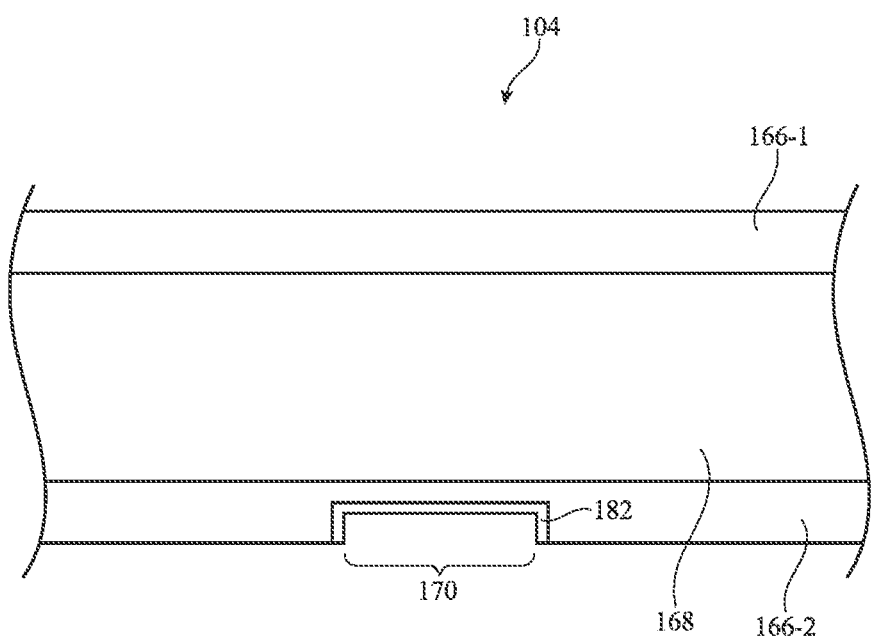
FIG. 17 is a cross-sectional side view of illustrative ring tape having a cut-out through only one of its layers and an additional layer formed in the cut-out in accordance with an embodiment.

In the cross-sectional side view of FIG. 17, ring tape 104 again has a polymer film 168 interposed between pressure sensitive adhesive layers 166-1 and 166-2. However, the ring tape of FIG. 17 has a cut-out 170 formed only in adhesive layer 166-2. Polymer film 168 and adhesive layer 166-1 are left un-cut. Cut-out 170 may extend only partially through adhesive layer 166-2 (as shown in FIG. 17). In other words, a first portion of adhesive layer 166-2 is cut and a second portion of adhesive layer 166-2 is left un-cut. This example is merely illustrative and cut-out 170 may extend entirely through adhesive layer 166-2 (as shown in FIG. 14) if desired. An additional layer 182 may be formed within cut-out 170 (e.g., on the exposed portions of adhesive layer 166-2). Additional layer 182 may be a non-adhesive layer. Layer 182 may be a polymer layer, as one example. Layer 182 may be formed from the same material as polymer film 168 or may be formed from a different material than polymer film 168.

In FIGS. 13-17, the ring tape may be attached to a layer of backlight unit 42 on one side (e.g., chassis 102 in FIG. 6). The layer of backlight unit 42 may be on either side of the ring tape in FIGS. 13-17. For example, in FIG. 14 the layer of backlight unit 42 may be attached to upper adhesive layer 166-1 (e.g., to an upper surface of the ring tape) or to lower adhesive layer 166-2 (e.g., to a lower surface of the ring tape). For all of the embodiments of FIGS. 13-17, the layer of backlight unit 42 may be attached to either the upper surface of the ring tape or the lower surface of the ring tape.

The foregoing is merely illustrative and various modifications can be made by those skilled in the art without departing from the scope and spirit of the described embodiments. The foregoing embodiments may be implemented individually or in any combination.

What is claimed is:

1. A display backlight comprising:
    a flexible printed circuit board;
    a row of light-emitting diodes mounted on the flexible printed circuit board;
    a light guide layer having first and second opposing surfaces connected by an edge, wherein the edge receives light from the row of light-emitting diodes; and
    a chassis that extends around a periphery of the light guide layer, wherein the chassis has a first portion that is adjacent to the row of light-emitting diodes and that is attached to the flexible printed circuit board and wherein the chassis has a second portion that extends over the row of light-emitting diodes.

2. The display backlight defined in claim 1, wherein each light-emitting diode of the row of light-emitting diodes is soldered to the flexible printed circuit board.

3. The display backlight defined in claim 2, further comprising:
    a plurality of adhesive patches that attach the first surface of the light guide layer to the flexible printed circuit board; and
    a patterned layer of adhesive that is formed over the row of light-emitting diodes and the second surface of the light guide layer.

4. The display backlight defined in claim 3, wherein the patterned layer of adhesive has a plurality of protruding portions and wherein each protruding portion of the plurality of protruding portions overlaps a respective adhesive patch of the plurality of adhesive patches.

5. The display backlight defined in claim 3, further comprising:
    a first optical film formed over the light guide layer, wherein a portion of the first optical film overlaps the patterned layer of adhesive; and
    a second optical film formed over the first optical film.

6. The display backlight defined in claim 5, wherein the first optical film is a diffuser layer and the second optical film is a brightness enhancement film.

7. The display backlight defined in claim 5, further comprising:
    an additional adhesive layer that is attached to an upper surface of the second optical film and an upper surface of the chassis.

8. The display backlight defined in claim 7, wherein the additional adhesive layer comprises a polymer film interposed between first and second pressure sensitive adhesive layers and a cut-out in the first pressure sensitive adhesive layer.

9. The display backlight defined in claim 8, wherein the first pressure sensitive layer is attached to the upper surface of the second optical film and the upper surface of the chassis.

10. The display backlight defined in claim 8, wherein the second pressure sensitive layer is attached to the upper surface of the second optical film and the upper surface of the chassis.

11. The display backlight defined in claim 8, further comprising:
    an additional polymer film formed within the cut-out in the first pressure sensitive adhesive layer.

12. The display backlight defined in claim 11, wherein the cut-out in the first pressure sensitive adhesive layer extends only partially through the first pressure sensitive adhesive layer and wherein the additional polymer film is attached directly to the first pressure sensitive adhesive layer in the cut-out.

13. The display backlight defined in claim 7, wherein the additional adhesive layer comprises a first piece of tape and a second piece of tape, wherein the first piece of tape comprises a polymer film interposed between first and second pressure sensitive adhesive layers, wherein the first piece of tape comprises a cut-out through the first pressure sensitive adhesive layer, the polymer film, and the second pressure sensitive adhesive layer, and wherein the second piece of tape fills the cut-out in the first piece of tape.

14. The display backlight defined in claim 7, wherein the additional adhesive layer comprises a first piece of tape and a second piece of tape, wherein the first piece of tape comprises a polymer film interposed between first and second pressure sensitive adhesive layers, wherein the first piece of tape comprises a cut-out through the first pressure sensitive adhesive layer, the polymer film, and the second pressure sensitive adhesive layer, and wherein the second piece of tape is formed over the cut-out and attached to the first piece of tape on opposing sides of the cut-out.

15. The display backlight defined in claim 7, further comprising:
    a spacer interposed between the portion of the first optical film that overlaps the patterned layer of adhesive and the additional adhesive layer.

16. The display backlight defined in claim 1, further comprising:
    a reflector layer positioned below the first surface of the light guide layer; and
    a heat spreading layer attached to the flexible printed circuit board and the reflector layer.

17. The display backlight defined in claim 16, further comprising:
    a strip of adhesive that attaches the heat spreading layer to the flexible printed circuit board; and
    first and second patches of adhesive that attach the heat spreading layer to the reflector layer.

18. The display backlight defined in claim 16, further comprising:
    an opaque adhesive layer that is attached to a lower surface of the heat spreading layer and a side surface of the chassis.

19. The display backlight defined in claim 1, wherein each light-emitting diode has two light-emitting areas.

20. The display backlight defined in claim 1, further comprising:
    first, second, and third solder pads on the flexible printed circuit board, wherein a first light-emitting diode of the row of light-emitting diodes overlaps the first, second, and third solder pads; and a first adhesive patch that is interposed between the first and second solder pads and that attaches the first light-emitting diode to the flexible printed circuit board; and a second adhesive patch that is interposed between the second and third solder pads and that attaches the first light-emitting diode to the flexible printed circuit board.

21. A display backlight comprising:
a flexible printed circuit board;
a row of light-emitting diodes mounted on the flexible printed circuit board;
at least first and second solder pads on the flexible printed circuit board, wherein a first light-emitting diode of the row of light-emitting diodes overlaps the first and second solder pads;
a first adhesive patch that attaches the first light-emitting diode to the flexible printed circuit board; and
a light guide layer having first and second opposing surfaces connected by an edge, wherein the edge receives light from the row of light-emitting diodes.

22. The display backlight defined in claim 21, wherein the first adhesive patch is interposed between the first and second solder pads on the flexible printed circuit board.

23. A display backlight comprising:
a flexible printed circuit board;
a row of light-emitting diodes mounted on the flexible printed circuit board;
a light guide layer having first and second opposing surfaces connected by an edge, wherein the edge receives light from the row of light-emitting diodes;
a reflector layer that is positioned below the first surface of the light guide layer and that has a first width;
a heat spreading layer that is attached to the reflector layer and the flexible printed circuit board, wherein the heat spreading layer has a second width that is less than the first width;
a strip of adhesive that attaches the heat spreading layer to the flexible printed circuit board; and
first and second patches of adhesive that attach the heat spreading layer to the reflector layer.

24. The display backlight defined in claim 23, wherein the heat spreading layer comprises a layer of graphite interposed between first and second polymer films.

25. The display backlight defined in claim 23, wherein the heat spreading layer comprises first and second opposing edges connected by third and fourth opposing edges, wherein the strip of adhesive is formed along the first edge of the heat spreading layer, wherein the first patch of adhesive is formed in a first corner of the heat spreading layer where the second edge meets the third edge, and wherein the second patch of adhesive is formed in a second corner of the heat spreading layer where the second edge meets the fourth edge.

26. A display backlight comprising:
a flexible printed circuit board;
a row of light-emitting diodes mounted on the flexible printed circuit board;
a light guide layer having first and second opposing surfaces connected by an edge, wherein the edge receives light from the row of light-emitting diodes;
a plurality of adhesive patches that attach the first surface of the light guide layer to the flexible printed circuit board; and
a patterned layer of adhesive that is formed over the row of light-emitting diodes and the second surface of the light guide layer, wherein the patterned layer of adhesive has a plurality of protruding portions and wherein each protruding portion of the plurality of protruding portions overlaps a respective adhesive patch of the plurality of adhesive patches.

27. The display backlight defined in claim 26, wherein the plurality of protruding portions include a first set of protruding portions that are interposed between adjacent light-emitting diodes in the row of light-emitting diodes and a second set of protruding portions that each extend from the middle of a respective light-emitting diode of the row of light-emitting diodes.

* * * * *